United States Patent [19]

Yoshida et al.

[11] Patent Number: 4,983,110
[45] Date of Patent: Jan. 8, 1991

[54] RESIN ENCAPSULATING APPARATUS FOR SEMICONDUCTOR DEVICES

[75] Inventors: Isamu Yoshida; Junichi Saeki, both of Yokohama; Shigeharu Tsunoda, Fujisawa; Kunihiko Nishi, Tokyo; Masao Mitani, Yokohama, all of Japan

[73] Assignee: Hitachi, Ltd., Tokyo, Japan

[21] Appl. No.: 323,497

[22] Filed: Mar. 13, 1989

[30] Foreign Application Priority Data

Mar. 14, 1988 [JP] Japan .................................. 63-58257
Apr. 7, 1988 [JP] Japan .................................. 63-83978

[51] Int. Cl.⁵ .................... B29C 45/02; B29C 45/14;
B29C 45/32; B29L 31/34
[52] U.S. Cl. ............................. 425/116; 264/272.11;
264/272.17; 425/121; 425/544; 425/588;
437/207
[58] Field of Search ................... 264/272.11, 272.17;
425/588, 544, 116, 123, 121, 125, DIG. 218;
437/207, 211, 212, 219

[56] References Cited

U.S. PATENT DOCUMENTS

| | | | |
|---|---|---|---|
| 4,554,126 | 11/1985 | Sera | 264/272.17 |
| 4,767,302 | 8/1988 | Okamoto et al. | 425/588 |
| 4,900,501 | 2/1990 | Saeki et al. | 425/116 |

FOREIGN PATENT DOCUMENTS

| | | |
|---|---|---|
| 58-217313 | 12/1983 | Japan . |
| 61-292330 | 12/1986 | Japan . |
| 62-122136 | 6/1987 | Japan . |
| 63-293021 | 11/1988 | Japan . |

Primary Examiner—Jay H. Woo
Assistant Examiner—Khanh P. Nguyen
Attorney, Agent, or Firm—Fay, Sharpe, Beall, Fagan, Minnich & McKee

[57] ABSTRACT

A resin encapsulating apparatus for semiconductor devices is characterized by including a rectangular pot constituted by being surrounded with two opposed wall surfaces of short side each having an outwardly projecting curved surface and two opposed wall surfaces of long side which are each substantially in the form of a straight line; a plurality of cavity lines connected respectively through gates to the bottom portion of at least one said long-side wall surface of the pot, the cavity lines each consisting of cavities connected in series; and a plunger to be inserted into the pot.

7 Claims, 8 Drawing Sheets

RESIN ENCAPSULATING APPARATUS FOR SEMICONDUCTOR DEVICES

BACKGROUND OF THE INVENTION

The present invention relates to a resin molded semiconductor device manufacturing apparatus and a resin encapsulating method for such semiconductor devices using the said apparatus. More particularly, it is concerned with a semiconductor device resin encapsulating apparatus having a mold suitable for improving the production efficiency and the quality of product, as well as a semiconductor device resin encapsulating method using the said apparatus.

According to a conventional like apparatus, as described in Japanese Pat. Laid-Open No. 292330/86, a plurality of pots communicating with each other through sub runners are provided within a mold, and product cavities are connected to distal ends of a pair of main runners connected in opposed relation to each of the pots. According to another conventional like apparatus, as described in Japanese Pat. Laid-Open No. 122136/87, a plurality of runners are connected to each pot and a plurality of product cavities are connected in series to the distal end of each of the runners.

In the apparatus disclosed in the above Japanese Pat. laid-open 292330/86, the structure of the mold is complicated because sub runners are required to make communication between pots, resulting in the mold itself becoming expensive; besides, since the interior of each sub runner is filled with extra resin, a limit is encountered in the improvement of the yield of resin material. Only 50% at most of the resin fed is utilized for the product and thus this is uneconomical.

In the apparatus disclosed in the above Japanese Pat. laid-open 122136/87, a plurality of cavities are connected in series to each of plural runners which are each independently connected to each of plural pots, but since tablets fed to each pot are generally not uniform in weight, a limit is encountered in equalizing the internal pressure of a mold flow channel formed between adjacent pots. That is, the problem to be solved in the prior art is to attain effective utilization of resin and make the internal pressure of the mold flow channel as uniform as possible to improve the yield in the resin encapsulation for a semiconductor device.

SUMMARY OF THE INVENTION

It is the first object of the present invention to provide a resin encapsulating apparatus for semiconductor devices capable of not only solving the above-mentioned technical problem but also improving the production efficiency and the quality of product.

It is the second object of the present invention to provide a resin encapsulating method for semiconductor devices capable of achieving the first object.

According to the present invention, in order to achieve the above first object, there is provided a resin encapsulating apparatus for semiconductor devices including a rectangular pot constituted by being surrounded with two opposed wall surfaces of short side each having an outwardly projecting curved surface and two opposed wall surfaces of long side which are each substantially in the form of a straight line; a plurality of cavity lines connected to the bottom portion of at least one wall surface of long side of the pot in series through gates; and a plunger inserted into the pot.

According to the present invention, moreover, in order to achieve the above second object, there is provided a resin encapsulating method for semiconductor devices. The method employs a resin encapsulating apparatus for semiconductor devices including a rectangular pot constituted by being surrounded with two opposed wall surfaces of short side each having an outwardly projecting curved surface and two opposed wall surfaces of long side which are each substantially in the form of a straight line; a plurality of cavity lines connected to the bottom portion of at least one wall surface of long side of the pot in series through gates; and a plunger to be inserted into the pot. A lead frame with semiconductor chips mounted thereon is put in the cavities, then resin is fed into the pot, and the plunger is inserted into the pot and pressed to have the fed resin transferred to the cavities, thereby obtaining resin moldings of the semiconductor chips.

Further, according to the present invention, a plurality of resin transferring gates formed each independently in the above wall surface of long side of the pot and a plurality of cavity lines connected in series to the distal ends of the gates have a structure of exchangeable mold block (fitting structure) and are removably mounted to the first mold. These can be easily replaced with a third mold having predetermined gates and cavity lines. Where a part of a cavity pattern is formed also on the opposed surface of the second mold corresponding to the removable portion of the first mold, it is of course necessary to make that opposed surface portion removable for replacement like the first mold. By providing many kinds of such third molds having gates and cavity lines of such exchangeable mold block structure, it is possible to effect resin encapsulation over various kinds using the same encapsulating apparatus by changing only part of the molds. Not only can there be attained the saving of the time required for mold replacement, but also the same encapsulating apparatus can be used for main portions, which is extremely economical and is very desirable for the improvement of efficiency.

According to the present invention summarized above, as compared with the conventional one-pot system, the gates are connected to the pot directly without through runners, resulting in that the flow channel becomes very short and the amount of resin flowing through the channel may be small. For this reason, even if plural cavities are disposed at the distal ends of the gates and molding is performed, the pressure loss can be made smaller than that in the conventional one-pot system and the yield of resin material can be greatly improved in an extremely reduced generation of molding defect caused by increase of pressure loss. Moreover, the urging force of the resin extruded from the pot can be made uniform because of a one-pot system. Further, since each plunger can be connected directly to a rod of a molding machine, it is possible to control the operation of the plungers precisely from the molding machine side, whereby the quality of product can be improved to a great extent. Besides, by making the flow channel forming portion other than the pot or the mold portion which constitute the gates and plungers replaceable, it is possible to easily effect production at different flow channel structures and different kinds of products. Additionally, since plurally separated plungers are disposed for one common pot, it is easy to position the plungers relative to each other and the fabrication and adjustment of mold become easier.

BRIEF DESCRIPTION OF THE DRAWINGS

FIG. 2 is a characteristic diagram showing a comparison in effect between a resin encapsulating method for semiconductor devices according to the present invention and a comparative example, in which

DETAILED DESCRIPTION OF THE PREFERRED EMBODIMENTS

A first embodiment of the present invention will be described below with reference to FIG. 1.

Figure 1A:
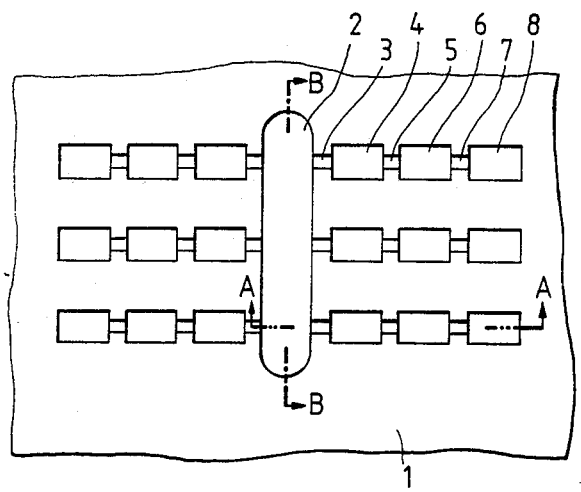
FIG. 1(a) is a plan view of a lower mold according to a first embodiment of the present invention.

FIG. 1 shows the construction of an apparatus embodying the present invention. FIG. 1(a) is a plan view of a lower mold 1, wherein the numeral 2 denotes a rectangular pot for pressure feed of a molding resin, the rectangular pot 2 having two, outwardly projecting, arcuate wall surfaces of short side, and numeral 3 denotes a first gate formed in the pot 2. A first cavity 4 is disposed in connection with the first gate 3, and behind the first cavity 4, that is, on the downstream side in the feed of resin, a second gate 5 is provided. Further, a second cavity 6 is disposed in connection with the second gate 5, and on the downstream side of the second cavity 6 is connected a third cavity 8 through a third gate 7. Thus, in this embodiment, three cavity lines connected in series are disposed in three pairs on both sides of the pot 2.

The ratio of the long to the short side of the rectangular shape of the pot is not smaller than 2. This is because two or more tablets of the same shape can be fed at a time.

Figure 1B:
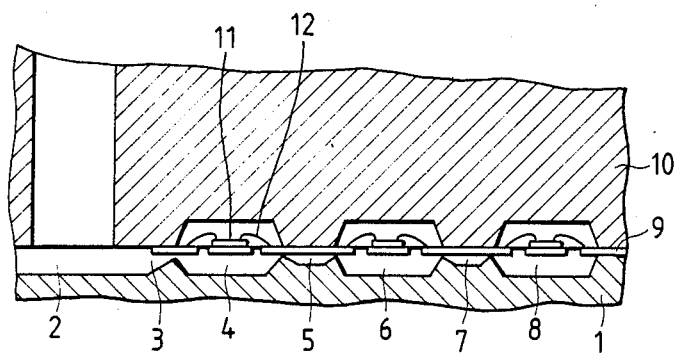
FIG. 1(b) is a sectional view taken on line A—A of FIG. 1(a)

FIG. 1(b) is a sectional view taken on line A—A of FIG. 1(a) with a lead frame 9 inserted between an upper mold 10 and the lower mold 1. On the lead frame 9 are mounted semiconductor chips 11 in positions opposed to the interiors of the first, second and third cavities 4, 6, 8. Bonding pads of the semiconductor chips 11 and the lead frame 9 are interconnected with gold wires 12 to constitute an electric component to be molded.

Figure 1C:
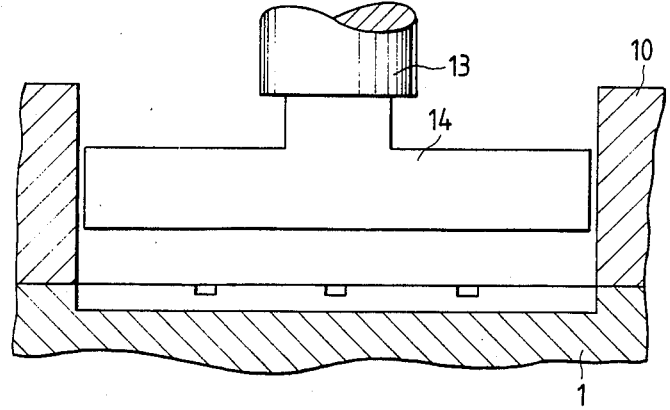
FIG. 1(c) is a sectional view taken on line B—B of FIG. 1(a)

FIG. 1(c) is a sectional view taken on line B—B of FIG. 1(a), with the upper and lower molds 10, 1 closed and a rectangular plunger 14 connected to a rod 13 of a molding machine (not shown).

Figure 6:
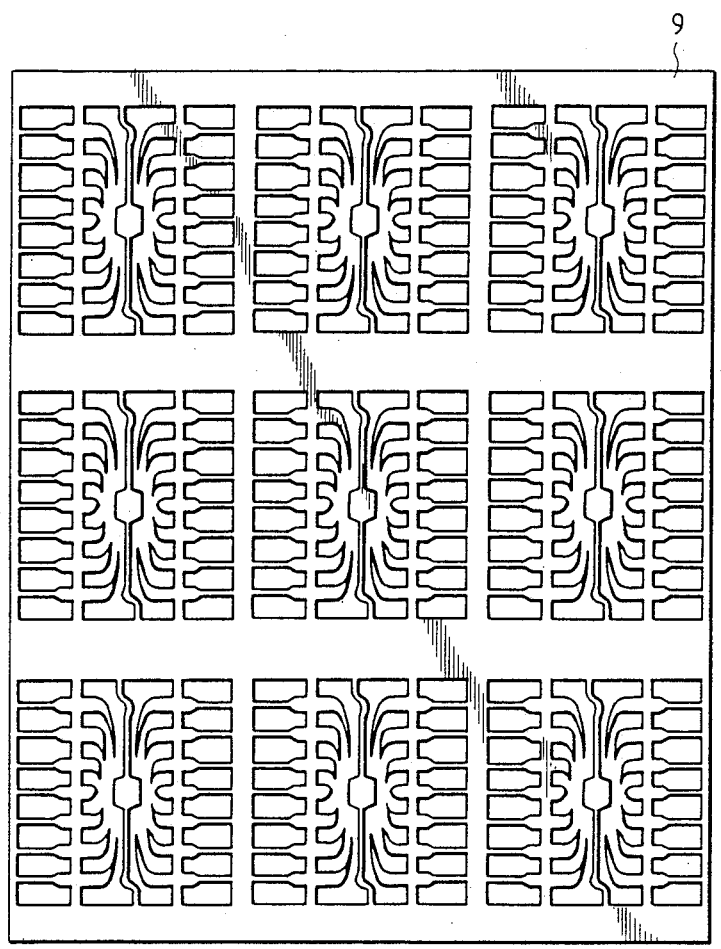
FIG. 6 is a view showing an example of a lead frame to be disposed over the cavities on either the right or left side of the pot in the mold according to the present invention.

FIG. 6 is a plan view of the lead frame 9 used in this embodiment and inserted for each of both sides of the pot on which are disposed three pairs of cavity lines, each line consisting of three cavities connected in series.

Figure 2A:
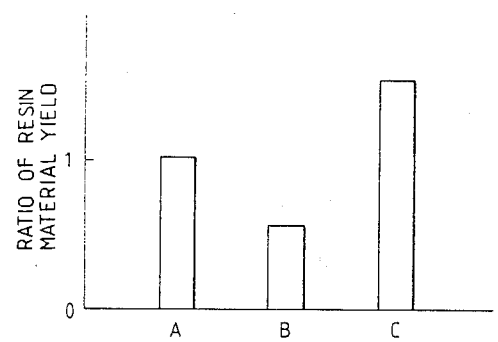
FIGS. 2(a), 2(b) and 2(c) are characteristic diagrams showing the ratio of resin material yield, ratio of pressure drop, and ratio of resin velocity in a cavity, respectively.
Figure 2B:
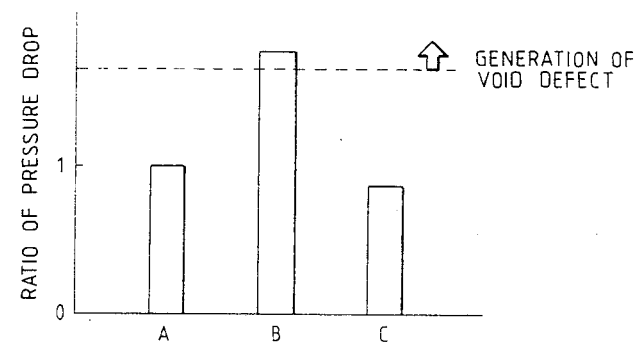
Figure 2C:
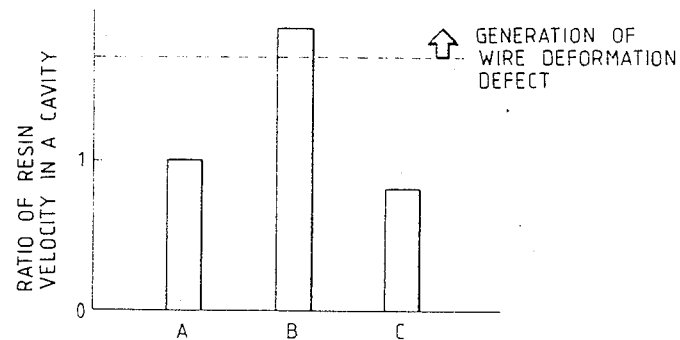

FIGS. 2(a) to 2(c) show characteristics obtained by the above method. In these figures, the reference mark A represents a first comparative example showing results obtained by using a mold wherein three pots are communicated with one another through sub runners and on the right and left sides of each pot are connected three cavities in series. The reference mark B represents a second comparative example showing results obtained by using a mold wherein a runner extends in one direction of a single pot and three pairs of cavity lines each consisting of three cavities connected in series are connected to the runner on each of the right and left sides of the runner. And the mark C shows the results of the embodiment of the present invention. These examples, including the embodiment of the invention, each have eighteen cavities for comparison under the same condition. FIGS. 2(a), 2(b) and 2(c) are characteristic diagrams for making comparisons with respect to the ratio of resin material yield, the ratio of pressure drop, and the ratio of resin velocity in a cavity, respectively. As is apparent from these figures, the embodiment of the invention, C, shows characteristics superior to the comparative examples A and B.

According to this embodiment of the present invention, as set forth above, since the flow channel is very short in a single pot system, not only the yield of resin material can be greatly improved but also the pressure after completion of the resin transfer to the cavities can be made uniform.

Although in the above embodiment three cavities are disposed in series in one flow channel to obtain three molded products, the present invention is not limited thereto. It goes without saying that the number of molded products to be obtained may be set suitably according to the size of the molded products and to what extent the resin used is easy to flow.

Next, a second embodiment of the present invention will be described below with reference to FIGS. 3(a) to 3(e) and 4(a) and 4(b).

Figure 3A:
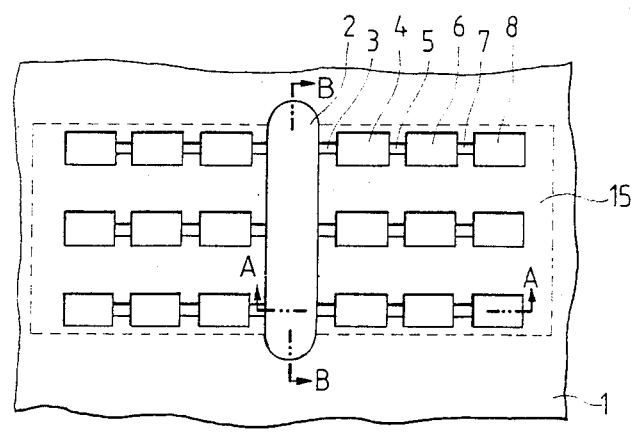
FIG. 3(a) is a plan view of a lower mold according to a second embodiment of the present invention.
Figure 3B:
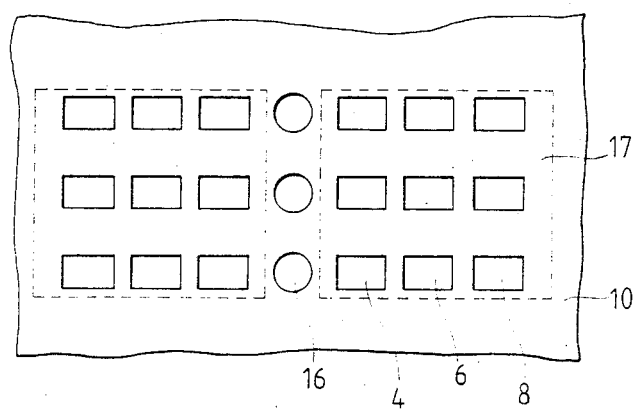
FIG. 3(b) is a plan view of an upper mold according to the second embodiment.
Figure 3C:
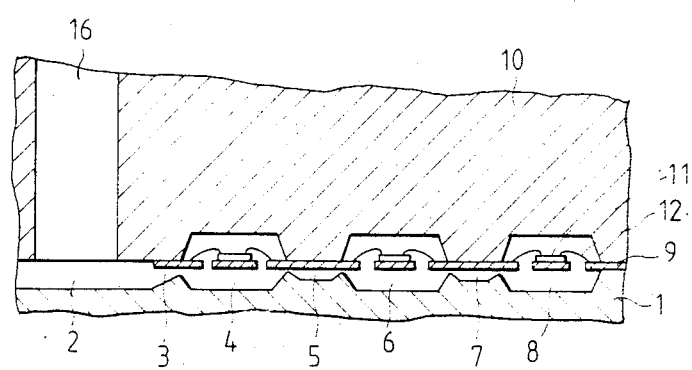
FIG. 3(c) is a sectional view taken on line A—A of FIG. 3(a) with a lead frame inserted between the upper and the lower mold.

FIG. 3(a) is a plan view of lower mold 1 which serves as a first mold. In the same figure, the numeral 2 denotes a rectangular common pot for pressure feed of a molding resin, and numeral 3 denotes a first gate formed in the bottom wall surface of the pot 2. Connected to the first gate 3 is a first cavity 4, behind which, namely, on the downstream side, there is disposed a second gate 5. And a second cavity 6 is connected to the second gate 5. Further, on the downstream side of the cavity 6 is connected a third cavity 8 through a third gate 7. Thus, in this embodiment three cavities are disposed in series. Numeral 15 indicates that the mold portion disposed around the pot 2 and shown in broken line is removable, having a structure of exchangeable mold block. FIG. 3(b) is a plan view of an upper mold 10 which serves as a second mold. In this figure, the numeral 16 denotes a cylinder through which a plunger (not shown) is movable, and numeral 17 represents a structure of exchangeable mold block with respect to the mold (removable) enclosed by a broken line. FIG. 3(c) is a sectional view taken on line A—A of FIG. 3(a) with a lead frame 13 inserted between the upper mold 10 and the lower mold 1. Chips 14 are mounted on the lead frame 13 in positions opposed to the interiors of the first, second and third cavities 4, 6, 8. The chips 11 and the lead frame 13 being interconnected using gold wires 12 to constitute an electric component to be molded. FIG. 6 shows an example of a lead frame 9, in which is illustrated a pattern of the lead frame inserted for each of both sides of the pot with three pairs of cavity lines disposed thereon, each line consisting of three cavities connected in series.

Figure 3D:
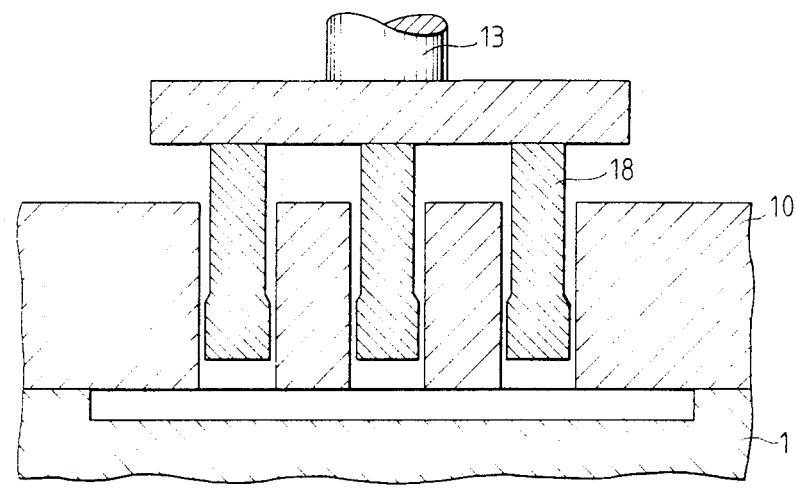
FIG. 3(d) is a sectional view taken on line B—B of FIG. 3(a) with the upper and lower mold closed and three plungers mounted, the three plungers being connected to a rod of a molding machine.
Figure 3E:
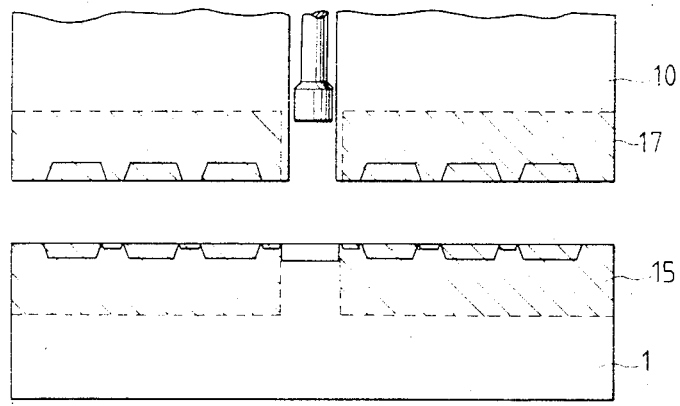
FIG. 3(e) is a schematic view showing both-side sections of FIGS. 3(a) and 3(b)

FIG. 3(d) is a sectional view taken on line B—B of FIG. 3(a) with the upper mold 10 and the lower mold 1 closed and three plungers 18 mounted, the plungers 18 being connected to a rod 21 of a molding machine (not shown). And FIG. 3(e) is a schematic view showing both-side sections of FIGS. 3(a) and 3(b), with exchangeable mold blocks 15 and 17 being inserted in the upper mold 10 and lower mold 1, respectively.

Figure 4A:
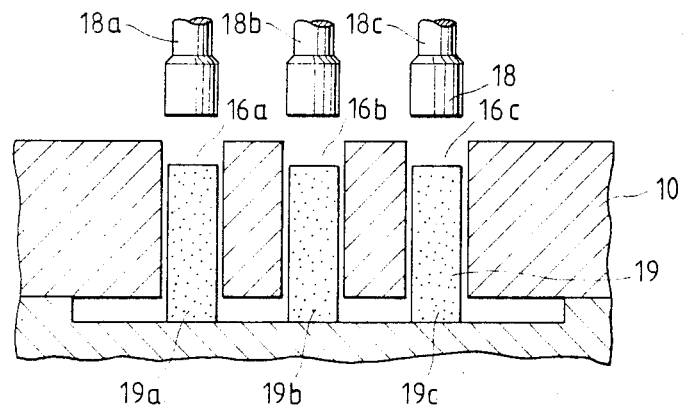
FIG. 4(a) is a sectional view of the upper and lower molds, showing that resin tablets are fed from cylinders mounted in the upper mold.
Figure 4B:
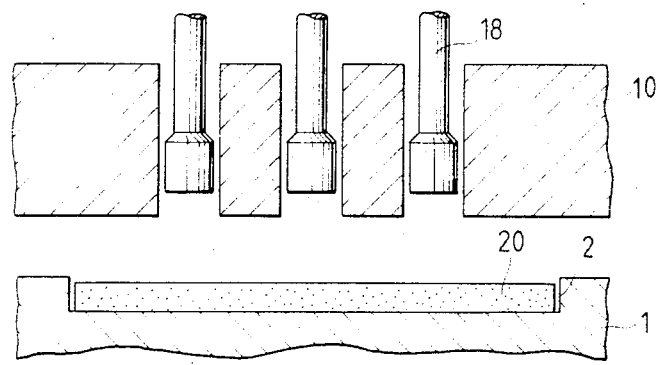
FIG. 4(b) is a sectional view of the upper and lower molds, showing that a resin sheet is pressed by the cylinders mounted in the upper mold.

FIGS. 4(a) and 4(b) illustrate alternative ways to effect resin encapsulation according to this embodiment. In FIG. 4(a), the upper mold 10 and lower mold 1 are closed, then resin tablets 19 (19a, 19b, 19c) are fed from the cylinders 16 (16a, 16b, 16c) and molded by the plungers 18 (18a, 18b, 18c). In FIG. 4(b), with the upper and lower molds 10, 1 open, a resin sheet 19 is fed into the pot 2, then the molds are closed and the plungers 17 are actuated to effect molding.

Figure 4C:
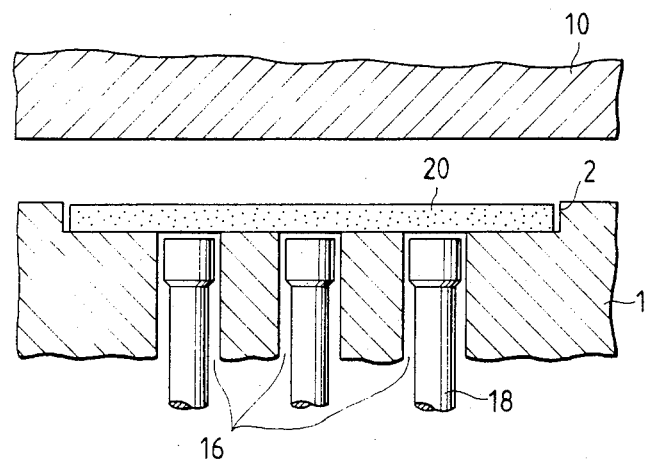
FIG. 4(c) is a sectional view of the upper and lower molds showing that a resin sheet is pressed from cylinders mounted in the lower mold.
Figure 4D:
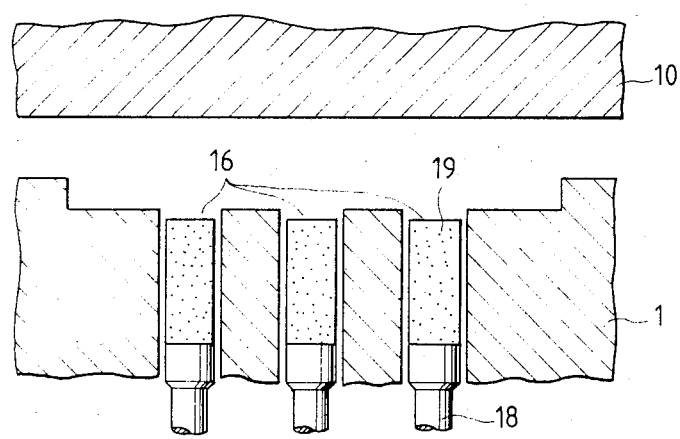
FIG. 4(d) is a sectional view of the upper and lower molds, showing that resin tablets are fed from the cylinders mounted in the lower mold.

Referring now to FIGS. 4(c) and 4(d), there is illustrated a third embodiment wherein both a pot 2 and cylinders 16 are formed in a first mold (a lower mold in this embodiment). More specifically, in FIG. 4(c), with upper and lower molds 10, 1 open, a resin sheet 19 is fed into the pot 2, then the molds are closed and plungers 18 are actuated to effect molding. In FIG. 4(d), with the upper and lower molds 10, 1 open, resin tablets 19 are fed into the cylinders 16, then the molds are closed and the plungers 18 are actuated to effect molding.

It goes without saying that also in FIGS. 4(a) to 4(d), a lead frame with semiconductor chips is inserted between the upper and the lower mold, as shown in FIG. 3(c).

Figure 5A:
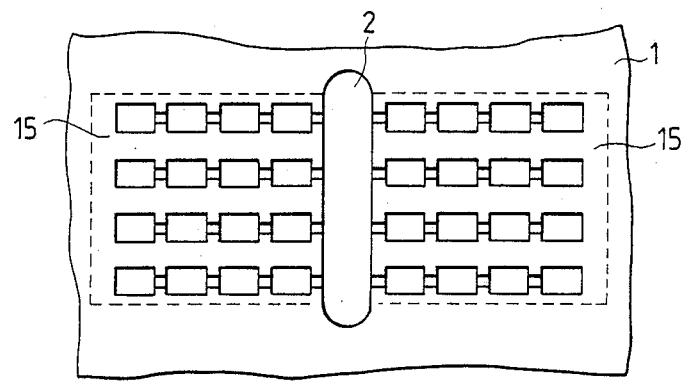
FIG. 5(a) is a view showing that, in the lower mold of FIG. 3(a), exchangeable mold blocks surrounded with the wall surfaces of long side of the pot and broken lines have been replaced by another mold having four gate and cavity lines.
Figure 5B:
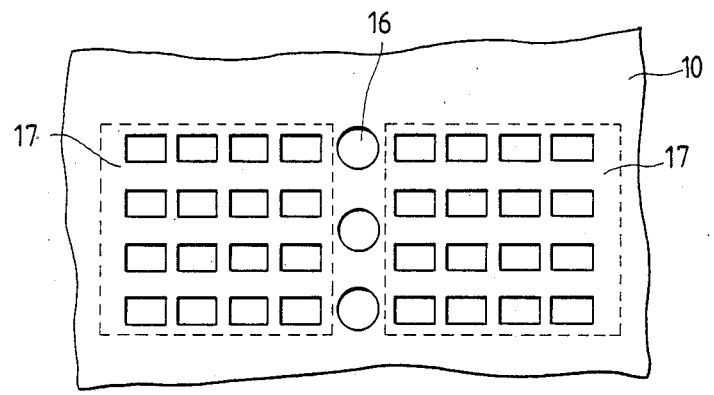
FIG. 5(b) is a view showing that, in the upper mold of FIG. 3(b), exchangeable mold blocks surrounded with broken lines have been replaced by another mold having four gate and cavity lines.
Figure 5C:
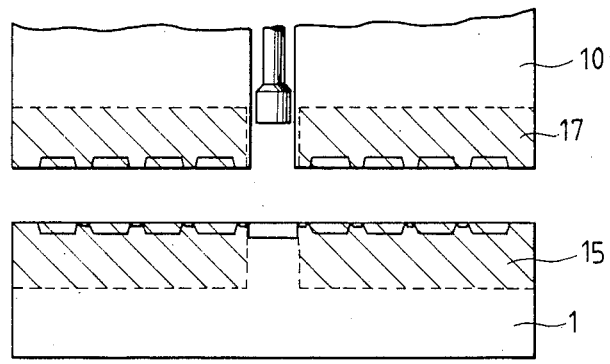
FIG. 5(c) is a schematic view showing side sections of FIGS. 5(a) and 5(b)

FIG. 5 shows a state in which, in the upper and lower molds 10, 1 of FIG. 3, exchangeable mold blocks 17 (FIG. 5(b)) each illustrated to be enclosed by a broken line and like blocks 15 (FIG. 5(a)) each illustrated to be enclosed by a long-side wall surface of the pot and a broken line comprise a third mold having a gate/cavity line pattern consisting of four cavity lines on one side each of which consists of four gates and cavities connected in series. FIG. 5(c) is a schematic view showing side sections of FIGS. 5(a) and 5(b), wherein the exchangeable mold blocks 17 and 15 are inserted in the upper and lower molds 10, 1, respectively.

In this embodiment, as set forth above, since the flow channel is very short, not only the yield of resin material can be greatly improved but also it is possible to make the pressure uniform after completion of the resin transfer to the cavities. Further, because of the exchangeable mold block structure with gates and cavities made integral, it is possible to easily effect molding of various kinds different in shape Additionally, both tablet and sheet may be adopted as the shape of the feed resin for molding.

Although in the above embodiments four cavities are disposed in series for each of eight flow channels (FIG. 5) or three cavities are disposed in series for each of six flow channels (FIG. 3) and three plungers are used for molding, the present invention is not limited thereto. It goes without saying that the number of cavities and that of flow channels may be decided suitably according to the size of mold, that of molded product, to what extent the resin used is easy to flow, etc.

It is preferable that plurally divided plungers be disposed at suitable intervals in the longitudinal direction of the pot without being localized and the shape of each plunger be circular in section in relation to the machining accuracy for the cylinders. Where one cylinder and one plunger are used in conformity with a rectangular shape of a pot, they are flat in shape, requiring a high-level technique for high machining accuracy.

Thus, according to the present invention, the yield of resin material can be improved remarkably without the problem of the generation of mold defect caused by increase in the flow resistance of resin. Moreover, because of a single pot system, the resin pressure after completion of the resin transfer to the cavities can be made uniform and at the same time it is possible to improve the quality of product. Further, the present invention can easily cope with resin encapsulation for various kinds.

We claim:

1. A resin encapsulating apparatus for semiconductor devices, including:
    a rectangular pot for receiving an encapsulating resin comprising two opposed wall surfaces of short side each having an outwardly projecting curved surface, and two opposed wall surfaces of long side substantially in the form of a straight line;
    a plurality of cavity lines and gates connected respectively to the bottom portion of at least one of said long-side wall surfaces of said pot, said cavity lines comprising cavities connected in series through the gate; and,
    a plunger to be inserted into said pot whereby resin may be urged by the plunger from the pot to the cavities through the gate to encapsulate semiconductor devices disposed in the cavities.

2. A resin encapsulating apparatus for semiconductor devices according to claim 1, wherein said plural cavity lines are connected in plural pairs to the bottom portions of both said long-side wall surfaces at predetermined intervals in an opposed relation with respect to the pot.

3. A resin encapsulating apparatus for semiconductor devices according to claim 1, wherein said plural cavity lines are connected to the bottom portions of both said long-side wall surfaces at predetermined intervals in an alternate relation with respect to the pot.

4. A resin encapsulating apparatus for semiconductor devices, including:
   a first mold having a rectangular pot formed therein, said rectangular pot being constituted by being surrounded with two opposed wall surfaces of short side each having an outwardly projecting curved surface and two opposed wall surfaces of long side which are each in the form of a straight line;
   a second mold having plurally divided cylinders disposed therein at predetermined intervals in positions opposed to the pot surfaces in the first mold;
   a plurality of plungers inserted respectively into said cylinders;
   a rod for actuating said plungers simultaneously vertically; and
   a plurality of gates for the transfer of resin connected each independently to the bottom portion of at least one of said long-side wall surface of said pot, and a plurality of cavity lines connected respectively through said gates to said bottom portion, said cavity lines each consisting of cavities connected in series.

5. A resin encapsulating apparatus for semiconductor devices according to claim 4, wherein said plural gates for the transfer of resin formed each independently in said long-side wall surface of the pot and said plural lines of cavities connected in series to the distal ends of said gates have a structure of exchangeable mold block and are mounted removably in said first mold and replaceable with a third mold which has predetermined number of gates and cavity lines.

6. A resin encapsulating apparatus for semiconductor devices, including:
   a first mold wherein there is formed a rectangular pot portion surrounded with two opposed wall surfaces of short side each having an outwardly projecting curved surface and two opposed wall surfaces of long side which are each in the for of a straight line, plurally divided cylinders are disposed at predetermined intervals in the back of said pot portion, a plurality of plungers are inserted respectively into said cylinders, a plurality of gates for the transfer of resin connected each independently to at least one of said long-side wall surfaces of said pot, and a plurality of cavity lines connected respectively through said gates to said long-side wall surface, said cavity lines each consisting of cavities connected in series;
   a second mold opposed to said first mold; and
   a rod for actuating said plungers in said cylinders simultaneously vertically.

7. A resin encapsulating apparatus for semiconductor devices according to claim 6, wherein said plural gates for the transfer of resin formed each independently in said long-side wall surface of the pot and said plural lines of cavities connected in series to the distal ends of said gates have a structure of exchangeable mold block and are mounted removably in said first mold and replaceable with a third mold which has predetermined number of gates and cavity lines.

* * * * *

UNITED STATES PATENT AND TRADEMARK OFFICE
CERTIFICATE OF CORRECTION

PATENT NO. : 4,983,110

DATED : January 8, 1991

INVENTOR(S) : Isamu Yoshida, et al

It is certified that error appears in the above-identified patent and that said Letters Patent is hereby corrected as shown below:

On the title page item [75] Inventor(s): "Aizo Kaneda, Yokohama" should appear before the name "Shigeharu Tsunoda".

Claim 6, column 8, line 9, delete "for" and insert therfor --form--.

Signed and Sealed this

Twenty-first Day of April, 1992

Attest:

HARRY F. MANBECK, JR.

*Attesting Officer*  *Commissioner of Patents and Trademarks*